US008218842B2

(12) United States Patent
Uchizono et al.

(10) Patent No.: US 8,218,842 B2
(45) Date of Patent: Jul. 10, 2012

(54) MAGNETIC RESONANCE IMAGING APPARATUS, IMAGE PROCESSING APPARATUS, AND IMAGE PROCESSING METHOD

(75) Inventors: Shinichi Uchizono, Nasushobara (JP); Kaoru Suzuki, Utsunomiya (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 995 days.

(21) Appl. No.: 12/194,020

(22) Filed: Aug. 19, 2008

(65) Prior Publication Data
US 2009/0052758 A1    Feb. 26, 2009

(30) Foreign Application Priority Data

Aug. 24, 2007    (JP) .................................. 2007-218093
Jun. 26, 2008    (JP) .................................. 2008-167166

(51) Int. Cl.
*G06K 9/00* (2006.01)

(52) U.S. Cl. ........................................ 382/131; 600/410
(58) Field of Classification Search ........................ None
See application file for complete search history.

(56) References Cited

U.S. PATENT DOCUMENTS

2007/0299332 A1* 12/2007 Ikeda ............................ 600/410

FOREIGN PATENT DOCUMENTS

JP    2005-118461    5/2005
JP    2008-005899    1/2008

* cited by examiner

*Primary Examiner* — Hoon Song
(74) *Attorney, Agent, or Firm* — Nixon & Vanderhye PC

(57) ABSTRACT

In a magnetic resonance imaging apparatus, an image storage unit correlates a reconstructed pre-correction image and a reconstructed post-correction image for each slice position and stores the correlated images. When a display condition related to a reconstructed image of one of either the reconstructed pre-correction image and the reconstructed post-correction image stored in the image storage unit is changed, the changed display condition is also applied to the other reconstructed image.

19 Claims, 5 Drawing Sheets

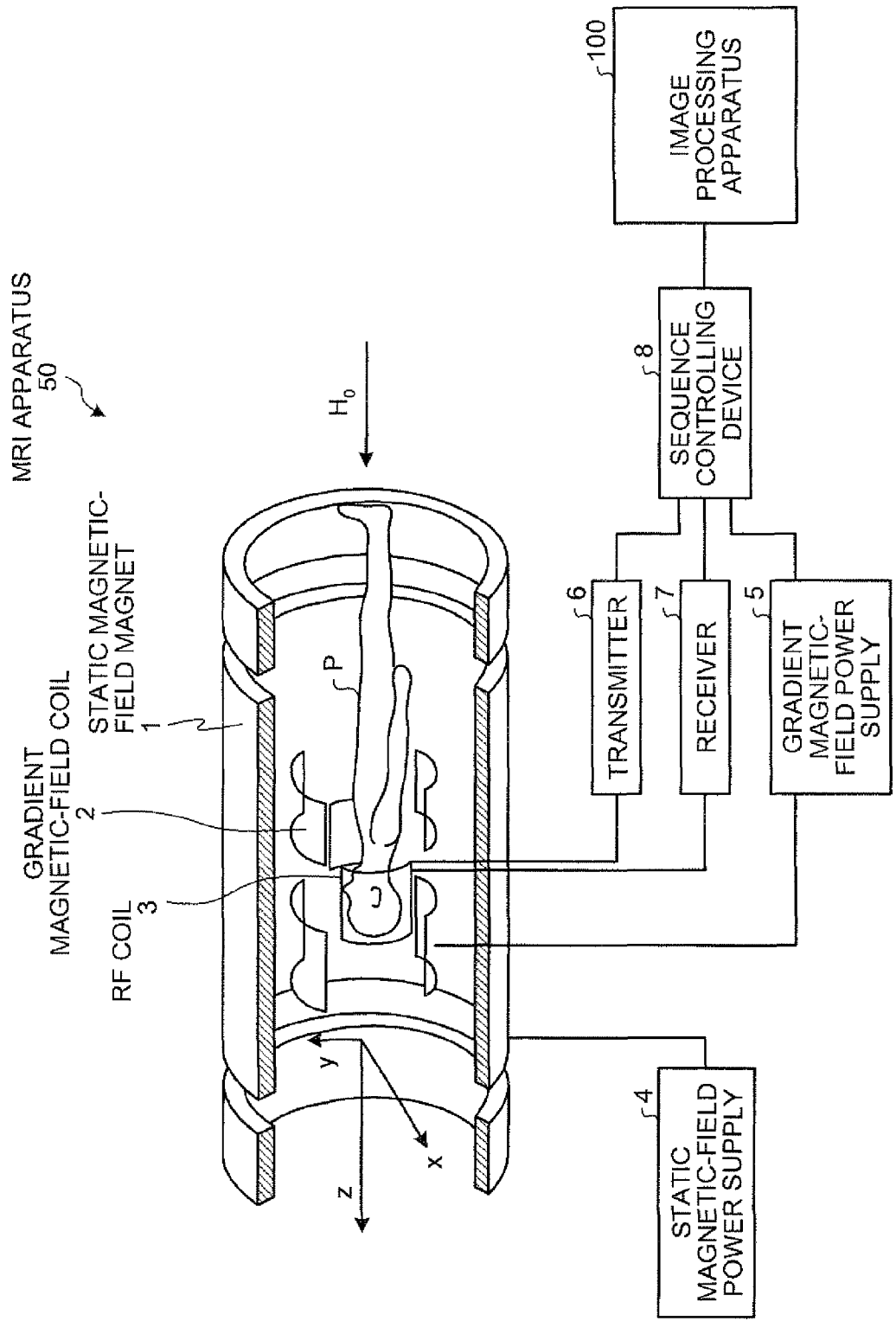

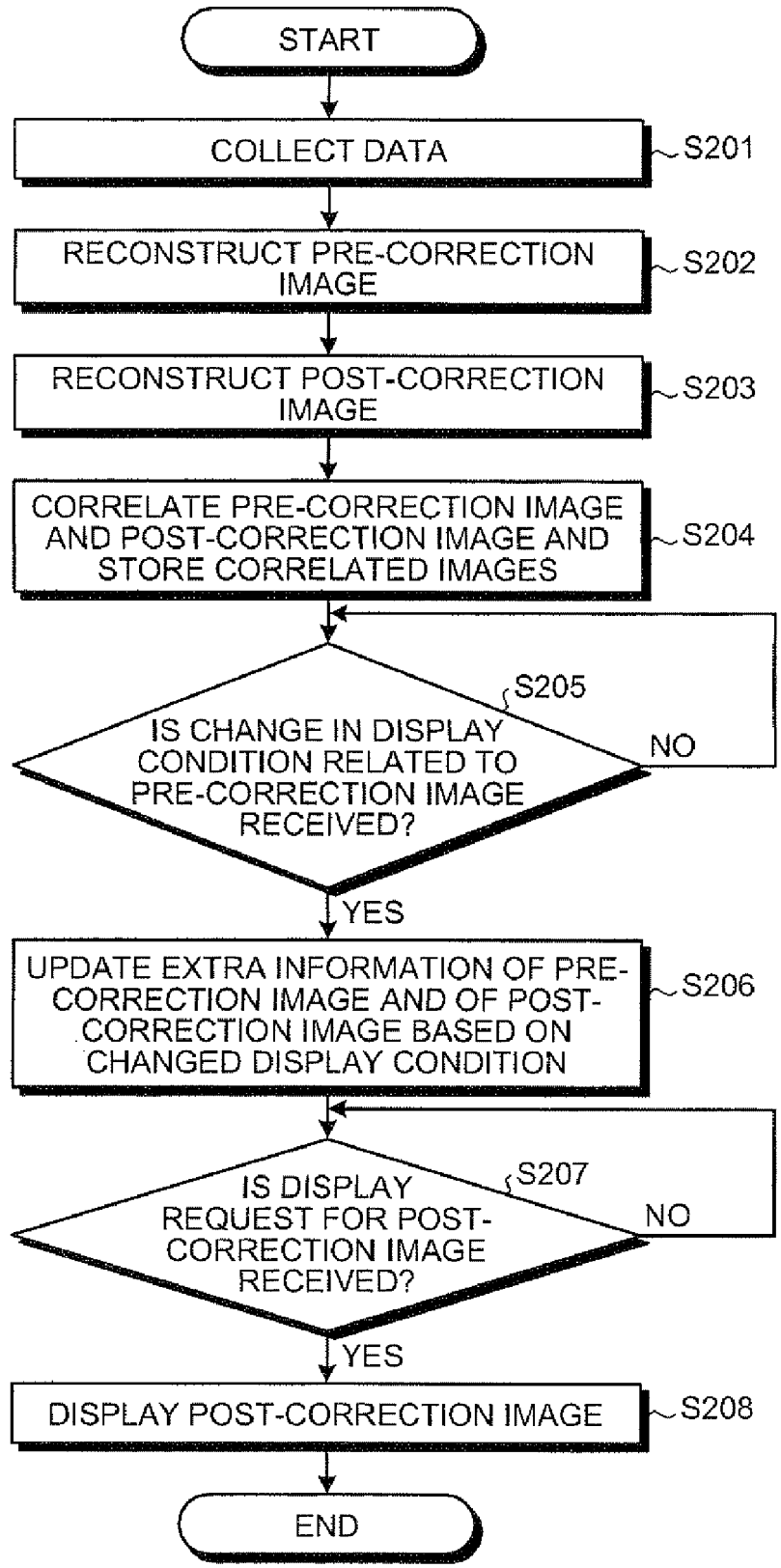

MAGNETIC RESONANCE IMAGING APPARATUS, IMAGE PROCESSING APPARATUS, AND IMAGE PROCESSING METHOD

CROSS-REFERENCE TO RELATED APPLICATIONS

This application is based upon and claims the benefit of priority from the prior Japanese Patent Application No. 2007-218093, filed on Aug. 24, 2007, and NO. 2008-167166, filed on Jun. 26, 2008; the entire contents of which are incorporated herein by reference.

BACKGROUND OF THE INVENTION

1. Field of the Invention

The present invention relates to a magnetic resonance imaging (MAI) apparatus, an image processing apparatus, and an image processing method that reconstruct an image from data related to an interior of a subject and collected using magnetic resonance phenomenon, and display the reconstructed image. In particular, the present invention relates to a change in a display condition under which a reconstructed image is displayed.

2. Description of the Related Art

Conventionally, in an MRI apparatus, a distortion appears in a reconstructed image when a disturbance in a magnetic field is present within an imaging area. In general, in the MRI apparatus, the disturbance in the magnetic field is measured by a predetermined method. Then, an image in which the distortion is corrected and an image before the distortion is corrected are reconstructed. The reconstructed post-correction image serves as an ordinary image used for diagnosis. At the same time, the reconstructed pre-correction image is used as a positioning image for scan planning or the like, serving as an image correctly indicating an imaging position (refer to, for example, JP-A 2005-118461 (KOKAI)).

However, in a conventional MRI apparatus, when a change is made in a display condition as a result of various imaging processing operations (image rotation, image inversion, panning process, and the like) and luminance conversion processes (window level adjustment, window width adjustment, and the like) being performed on the reconstructed post-correction image during diagnosis, a similar change is not reflected in the reconstructed pre-correction image. Therefore, when the reconstructed pre-correction image is used for scan planning and the like, the similar change is required to be made again, thereby involving a large amount of work.

SUMMARY OF THE INVENTION

According to one aspect of the present invention, a magnetic resonance imaging apparatus includes an image reconstructing unit that reconstructs an image from data related to an interior of a subject and collected using magnetic resonance phenomenon; an image storage unit that correlates a first reconstructed image and a second reconstructed image for each slice position and stores the correlated reconstructed images, the first reconstructed image being reconstructed by the image reconstructing unit, and the second reconstructed image in which data collection or a correction process is performed under a condition differing from that of the first reconstructed image; and an image display controlling unit that applies a changed display condition to the first reconstructed image, when a display condition of the second reconstructed image stored in the image storage unit is changed.

According to another aspect of the present invention, a magnetic resonance imaging apparatus includes an image reconstructing unit that reconstructs an image from data related to an interior of a subject and collected using magnetic resonance phenomenon; an image storage unit that correlates a first reconstructed image and a second reconstructed image for each slice position and stores the correlated reconstructed images, the first reconstructed image being reconstructed by the image reconstructing unit, and the second reconstructed image in which data collection or a correction process is performed under a condition differing from that of the first reconstructed image; and an image display controlling unit that applies a changed display condition to the second reconstructed image, when a display condition of the first reconstructed image stored in the image storage unit is changed.

According to still another aspect of the present invention, an image processing apparatus includes a image storage unit that correlates a first reconstructed image and a second reconstructed image for each slice position and stores correlated reconstructed images, the first reconstructed image being reconstructed from data related to an interior of a subject, and the second reconstructed image in which data collection or a correction process is performed under a condition differing from that of the first reconstructed image; and an image display controlling unit that applies a changed display condition to another reconstructed image, when a display condition of a reconstructed image of one of either the first reconstructed image and the second reconstructed image stored in the image storage unit is changed.

According to still another aspect of the present invention, an image processing method includes correlating a first reconstructed image and a second reconstructed image for each slice position and storing correlated reconstructed images, the first reconstructed image being reconstructed from data related to an interior of a subject, and the second reconstructed image in which data collection or a correction process is performed under a condition differing from that of the first reconstructed image; and applying a changed display condition to another reconstructed image, when a display condition of a reconstructed image of one of either the stored first reconstructed image and the stored second reconstructed image is changed.

BRIEF DESCRIPTION OF THE DRAWINGS

FIG. 2 is a functional block diagram of an overall configuration of the MRI apparatus according to the embodiment;

FIG. 5 is a flowchart of a process performed when a change made in a display condition for a pre-correction image is applied to a post-correction image.

DETAILED DESCRIPTION OF THE INVENTION

Exemplary embodiments of the present invention are below described with reference to the attached drawings. Hereinafter, a magnetic resonance imaging apparatus is referred to as an "MRI apparatus". A magnetic resonance signal emitted from a subject as a result of the subject being irradiated with a radio frequency (RF) pulse is referred to as an "MR signal".

Figure 1A:
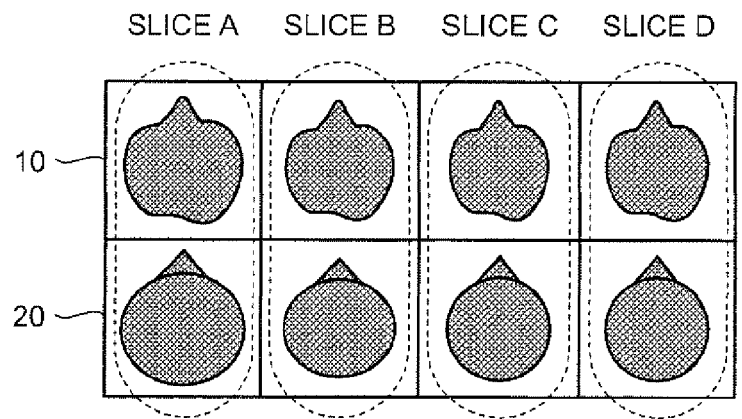
FIG. 1A is an explanatory diagram explaining a concept of interlinked changes in a display condition made by an MRI apparatus according to an embodiment.
Figure 1B:
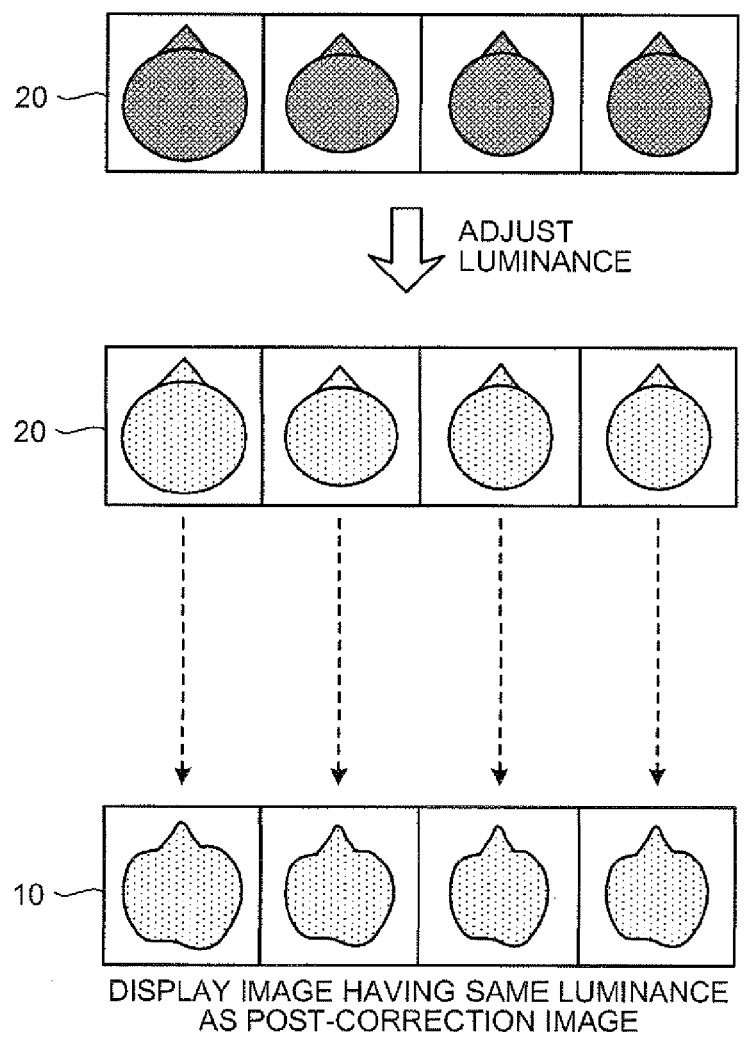
FIG. 1B is an explanatory diagram explaining the concept of interlinked changes in a display condition made by the MRI apparatus according to the embodiment.

First, a concept of interlinked changes in a display condition made by an MRI apparatus according to an embodiment will be described. FIG. 1A and FIG. 1B are explanatory diagrams explaining the concept of interlinked changes in a display condition made by the MRI apparatus according to the embodiment.

The MRI apparatus according to the embodiment collects data related to an interior of a subject by irradiating the subject with RE pulses and detecting MR signals emitted from the subject as a result. The MRI apparatus then reconstructs images from the collected data. When reconstructing the images, the MRI apparatus reconstructs an image reconstructed without a distortion caused by a disturbance in a magnetic field (referred to, hereinafter, as a "pre-correction image") being corrected and an image reconstructed after the distortion caused by the disturbance in the magnetic field is corrected (referred to, hereinafter, as a "post-correction image").

The MRI apparatus according to the embodiment correlates the reconstructed pre-correction image and post-correction image for each slice position and stores the correlated images. When a display condition is changed in the post-correction image, the changed display condition is automatically applied when the pre-correction image correlated with the post-correction image is displayed.

Specifically, as shown in FIG. 1A, when reconstructing the images from the collected data, the MRI apparatus correlates a pre-correction image 10 and a post-correction image 20 for each slice position (slice A-D) and stores the correlated images 10 and 20. The pre-correction image 10 is reconstructed without the distortion caused by a disturbance in the magnetic field being corrected. The post-correction image 20 is reconstructed after the distortion caused by the disturbance in the magnetic field is corrected.

Then, for example, as shown in FIG. 1B, it is assumed that an operator adjusts a luminance of the post-correction image 20. When the MRI apparatus receives a display request requesting that the pre-correction image 10 be displayed, the MRI apparatus changes a display condition of the pre-correction image 10 based on an adjustment to the luminance made in the post-correction image 20, thereby achieving a same luminance. The MRI apparatus then displays the pre-correction image 10.

As described above, in the MRI apparatus according to the embodiment, the reconstructed pre-correction image and the reconstructed post-correction image are correlated for each slice position, and the correlated images are stored. When a change in a display condition related to the reconstructed post-correction image is received during a scan planning or the like, the changed display condition is applied when the reconstructed pre-correction image is displayed. Therefore, display conditions for a plurality of related reconstructed images can be changed in conjunction.

Figure 3:
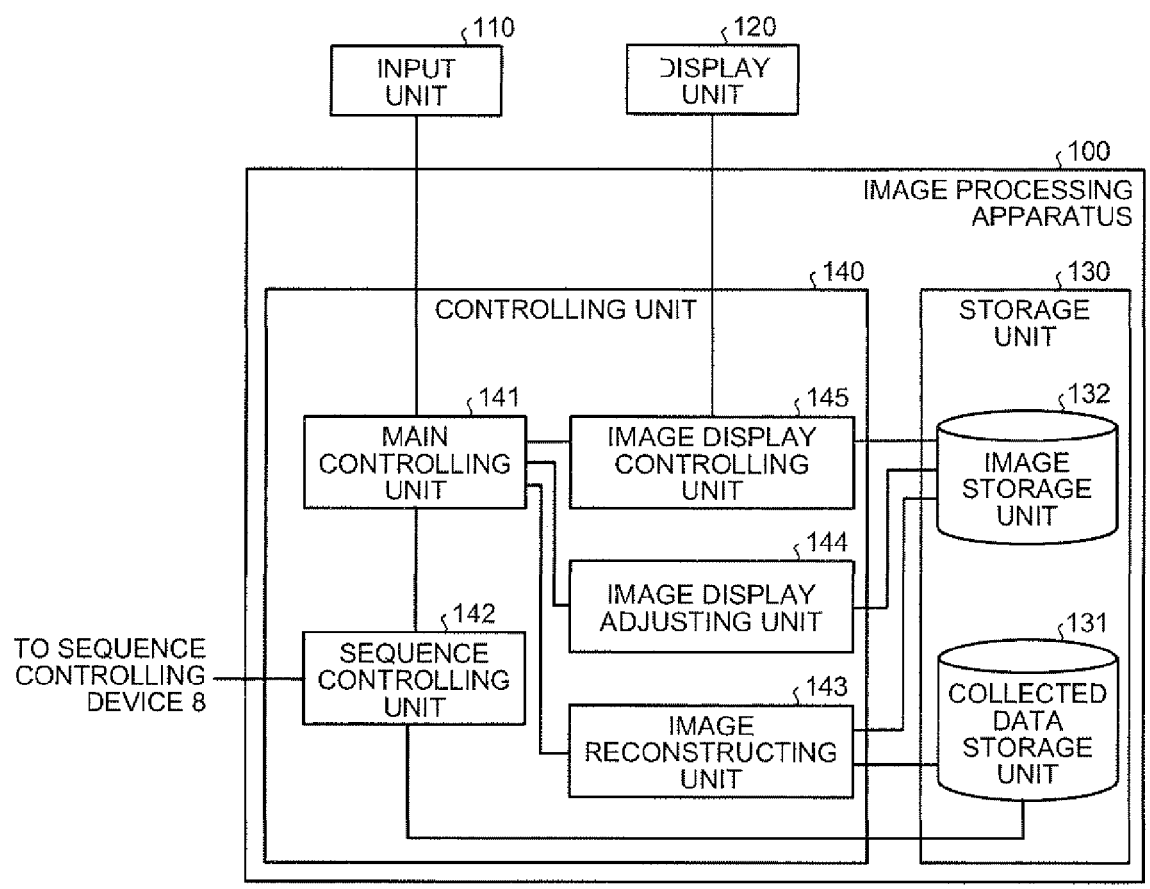
FIG. 3 is a functional block diagram of a configuration of an image processing apparatus according to the embodiment.
Figure 4:
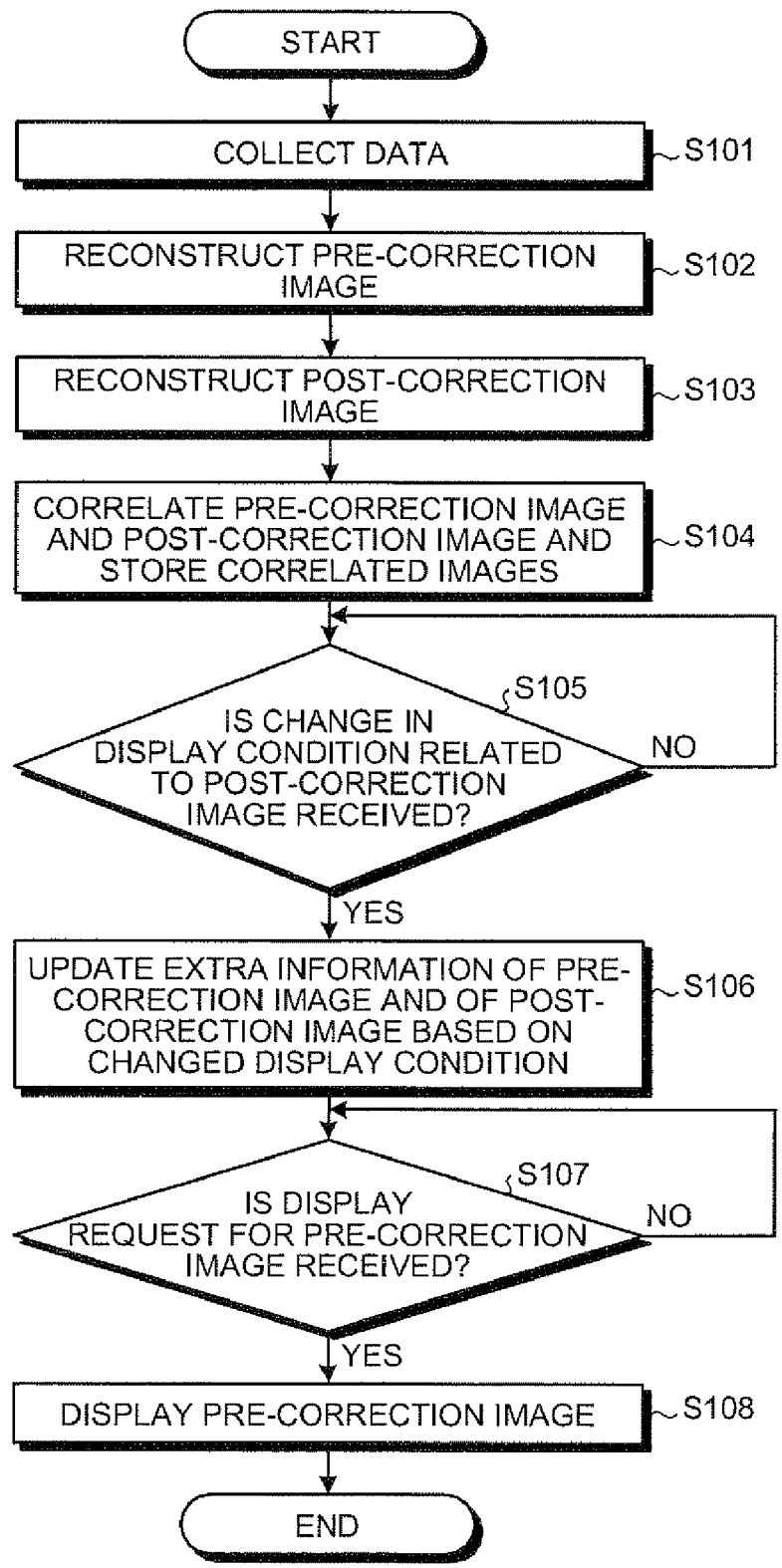
FIG. 4 is a flowchart of a process performed by the image processing apparatus according to the embodiment.

Hereafter, a configuration of the MRI apparatus and processes performed by the MRI apparatus will be described in detail, with reference to FIG. 2, FIG. 3, and FIG. 4. FIG. 2 is a functional block diagram of an overall configuration of the MRI apparatus according to the embodiment. FIG. 3 is a functional block diagram of a configuration of an image processing apparatus according to the embodiment. FIG. 4 is a flowchart of a process performed by the image processing apparatus according to the embodiment.

First, the overall configuration of the MRI apparatus according to the embodiment will be described with reference to FIG. 2. The MRI apparatus 50 includes a static magnetic-field magnet 1, gradient magnetic-field coils 2, an RF coil 3, a static magnetic-field power supply 4, a gradient magnetic-field power supply 5, a transmitter 6, a receiver 7, a sequence controlling device 8, and an image processing apparatus 100.

The static magnetic-field magnet 1 is a cylindrical magnet that generates a magnetostatic field $H_0$ in a space within a cylinder in which a subject P is placed. The static magnetic-field magnet 1 generates the magnetostatic field $H_0$ using an electrical current supplied by the static magnetic-field power supply 4. The gradient magnetic-field coils 2 are three pairs of coils disposed on an inner side of the static magnetic-field magnet 1. The gradient magnetic-field coils 2 generate gradient magnetic fields along three axial directions, x, y, and z, on the inner side of the static magnetic-field magnet 1 using an electric current supplied by the gradient magnetic-field power supply 5.

The RF coil 3 is a reception coil disposed facing the subject P within an opening of the static magnetic-field magnet 1. The RF coil 3 irradiates the subject P with the RF pulses transmitted from the transmitter 6 and receives the MR signals emitted from hydrogen nuclei in the subject P as a result of excitation. The static magnetic-field power supply 4 supplies the static magnetic-field magnet 1 with the electrical current. The gradient magnetic-field power supply 5 supplies the gradient magnetic-field coils 2 with the electrical current based on an instruction from the sequence controlling device 8.

The transmitter 6 transmits the RF pulses to the RF coil 3 based on an instruction from the sequence controlling device 8. The receiver 7 detects the MR signals received by the RE coil 3 and digitalizes the MR signals, thereby generating raw data. After generating the raw data from the MR signals, the receiver 7 transmits the generated raw data to the sequence controlling device B.

The sequence controlling device 8 performs imaging of the subject P by driving the gradient magnetic-field power supply 5, the transmitter 6, and the receiver 7 based on sequence information transmitted from the image processing apparatus 100. Here, the sequence information defines a process used to perform imaging. The sequence information includes a strength of the electrical current supplied to the gradient magnetic-field coils 2 by the gradient magnetic-field power supply 5 and a timing at which the electrical current is supplied, a strength of the RF pulses transmitted to the RE coil 3 from the transmitter 6 and a timing at which the RF pulses are transmitted, a timing at which the receiver 7 detects the MR signals, and the like. When the raw data is transmitted from the receiver 7 as a result of the subject P being imaged, the sequence controlling device 8 transfers the raw data to the image processing apparatus 100.

The image processing apparatus 100 controls the MRI apparatus 50 based on operations performed by the operator. The image processing apparatus 100 also converts the raw data transmitted from the sequence controlling device 8 to k-space data and reconstructs an image from the k-space data.

The MRI apparatus 50 includes a top plate on which the subject P is placed and a patient couch supporting the top plate (not shown). Images of a plurality of sites on the subject P can be taken as a result of the top plate being moved in a z direction. The top plate is manually or automatically moved.

Next, a configuration of the image processing apparatus 100 shown in FIG. 2 will be described with reference to FIG. 3. As shown in the diagram, the image processing apparatus 100 includes an input unit 110, a display unit 120, a storage unit 130, and a controlling unit 140.

The input unit 110 receives various inputs from the operator. The input unit 110 is actualized by a pointing device, a keyboard, and the like. The pointing device is, for example, a mouse and a trackball. In cooperation with the display unit 120 described hereafter, the input unit 110 provides the operator with a user interface used to receive various operations.

The display unit 120 displays various pieces of information, such as a scan image. The display unit 120 is actualized by a monitor device, such as a cathode ray tube (CRT) display and a liquid crystal display.

The storage unit 130 stores various pieces of information. The storage unit 130 includes a collected data storage unit 131 and an image storage unit 132. The collected data storage unit 131 stores the raw data transmitted from the sequence controlling device 8.

The image storage unit 132 stores reconstructed images reconstructed by an image reconstructing unit 143, described hereafter. The image storage unit 132 correlates the pre-correction image and the post-correction image for each slice position, and stores the correlated images. The pre-correction image is reconstructed without the distortion caused by a disturbance in the magnetic field being corrected. The post-correction image is reconstructed after the distortion caused by the disturbance in the magnetic field is corrected.

Respective extra information is added to each reconstructed image stored in the image storage unit 132. The extra information includes various pieces of attribute information related to the reconstructed image, display setting information used when the reconstructed image is displayed, and the like. In the display setting information, parameter values are set to control various processes related to adjustment of an image display. The various processes are, for example, imaging processing operations (image rotation, image inversion, panning process, enlargement process, and the like) and luminance conversion processes (window level adjustment, window width adjustment, and the like). The parameter values serve as display conditions under which each image is displayed.

The controlling unit 140 has an internal memory storing a control program such as an operating system (OS), a program prescribing various processes, and required data. The controlling unit 140 performs various processes using the stored programs and data. The controlling unit 140 includes a main controlling unit 141, a sequence controlling unit 142, the image reconstructing unit 143, an image display adjusting unit 144, and an image display controlling unit 145.

The main controlling unit 141 receives various instructions and various requests from the operator, via the input unit 110. The main controlling unit 141 controls operations of various functional units based on the received instructions and requests. Specifically, when an imaging instruction is received from the operator, the main controlling unit 141 generates sequence information based on specified imaging conditions and transmits the generated sequence information to the sequence controlling unit 142. The sequence information is transmitted to the sequence controlling device 8 via the sequence controlling unit 142 and is used by the sequence controlling device 8 when imaging is performed.

The main controlling unit 141 also receives a change in a display condition related to the post-correction image stored in the image storage unit 132 during diagnosis and the like. For example, the main controlling unit 141 receives various adjustments related to image display, such as image rotation, image inversion, panning process, enlargement process, window level adjustment, and window width adjustment performed on the post-correction image.

The sequence controlling unit 142 controls transmission and reception of data exchanged with the sequence controlling device 8. Specifically, when the sequence information is transmitted from the main controlling unit 141, the sequence controlling unit 142 transmits the sequence information to the sequence controlling device 8. When the raw data is transmitted from the sequence controlling device 8, the sequence controlling unit 142 stores the transmitted raw data in the collected data storage unit 131.

The image reconstructing unit 143 reconstructs an image based on the raw data stored in the collected data storage unit 131. Specifically, under the control of the main controlling unit 141, the image reconstructing unit 143 reads the raw data stored in the collected data storage unit 131 and converts the raw data to k-space data. The image reconstructing unit 143 performs a predetermined image reconstruction process, such as a Fourier transform process, on the k-space data and reconstructs a two-dimensional or three-dimensional image.

When reconstructing the image, the image reconstructing unit 143 reconstructs both the pre-correction image reconstructed without the distortion caused by a disturbance in the magnetic field being corrected and the post-correction image reconstructed after the distortion caused by a disturbance in the magnetic field is corrected. The image reconstructing unit 143 correlates the reconstructed pre-correction image and post-correction image of a same slice position for each slice position and stores the correlated images in the image storage unit 132.

The pre-correction image and the post-correction image are correlated, for example, by a common identifier being attached to each reconstructed image. Alternatively, when each reconstructed image has a unique identifier, the reconstructed images can be correlated by an identifier of a corresponding image being further attached to each reconstructed image.

The image display adjusting unit 144 updates the extra information of the pre-correction image stored in the image storage unit 132 based on the change in the display condition related to the post-correction image received by the main controlling unit 141. Specifically, when the main controlling unit 141 receives the change in the display condition related to the image display of the post-correction image, the image display adjusting unit 144 references the image storage unit 132 and updates the display setting information included in the extra information of the post-correction image based on the changed display condition.

In addition to updating the extra information of the post-correction image, the image display adjusting unit 144 similarly updates the display setting information included in the extra information of the pre-correction image correlated to the post-correction information. As a result of the extra information of the pre-correction image being updated in a similar manner as the extra information of the post-correction image, when a request is subsequently given for the pre-correction image to be displayed, such as during scan planning, the change in the display condition made for the post-correction image is applied to the pre-correction image. The pre-correction image is then displayed.

The image display controlling unit 145 controls the display of the reconstructed image, stored in the image storage unit 132, in the display unit 120. Specifically, when the main controlling unit 141 receives a display request for reconstructed image, the image display controlling unit 145 reads the requested reconstructed image from the image storage unit 132 and displays the read reconstructed image in the display unit 120.

When the reconstructed image Is displayed, the image display controlling unit 145 references the extra information of the read reconstructed image and performs the process related to the adjustment of the image display based on the display setting information included in the extra information. The process is, for example, an imaging processing operation (image rotation, image inversion, panning process, enlargement process, and the like) or a luminance conversion process (window level adjustment, window width adjustment, and the like). The image display controlling unit 145 then displays the reconstructed image.

As a result, when a display request for the pre-correction image is received during, for example, the scan planning, if the image display adjusting unit 144 has already updated the extra information of the pre-correction image, the pre-correction image is displayed after the image processing operation and the luminance conversion process is performed based on the parameter values after the update. In other words, when the display condition of the post-correction image correlated with the pre-correction image is already changed in the image storage unit 132, the pre-correction image of a same slice position is displayed after a similar change is made.

Here, the image display adjusting unit 144 updates the extra information of the pre-correction image correlated with the post-correction image at a timing at which the change in the display condition related to the post-correction image is received. Then, when the display request for the pre-correction image is received, the image display controlling unit 145 displays the requested pre-correction image based on the updated extra information.

However, the image display adjusting unit 144 needs not to update the extra information of the pre-correction image correlated at the timing at which the change in the display condition related to the post-correction image is received. In that case, when the display request for the pre-correction image is received, the image display controlling unit 145 identifies the post-correction image correlated with the pre-correction image by referencing the image storage unit 132, and changes the display condition of the requested pre-correction image.

Next, the process performed by the image processing apparatus 100 according to the embodiment will be described with reference to FIG. 4. In the image processing apparatus 100, first, the sequence controlling unit 142 collects the raw data (Step S101).

Next, the image reconstructing unit 143 reconstructs the pre-correction image and the post-correction image (Steps S102 and S103). The image reconstructing unit 143 correlates the reconstructed pre-correction image and post-correction image for each slice position and stores the correlated images in the image storage unit 132 (Step S104).

When the main controlling unit 141 receives the change in the display condition related to the post-correction image (Yes at Step S105), the image display adjusting unit 144 updates the extra information of the pre-correction image and of the post-correction image based on the changed display condition (Step S106).

When the main controlling unit 141 receives the display request for the pre-correction image (Yes at Step S107), the image display controlling unit 145 reads the requested pre-correction image from the image storage unit 132 and changes the display condition based on the display setting information included in the extra information. The image display controlling unit 145 then displays the pre-correction image (Step S108).

As described above, according to the embodiment, the image storage unit 132 correlates the pre-correction image and the post-correction image for each slice position and stores the correlated images. The main controlling unit 141 receives the change in the display condition related to the post-correction image. The image display adjusting unit 144 updates the extra information of the pre-correction image and of the post-correct-ion image based on the change in the display condition received by the main controlling unit 141. Then, when the main controlling unit 141 receives the display request for the pre-correction image, the image display controlling unit 145 displays the pre-correction image after changing the display condition based on the extra information updated by the image display adjusting unit 144. Therefore, the display conditions of a plurality of related reconstructed images can be changed in conjunction.

According to the embodiment, when the display condition of the post-correction image is changed, the changed display condition is applied to the pre-correction image. On the other hand, when the display condition of the pre-correction image is changed, the changed display condition can be applied to the post-correction image.

FIG. 5 is a flowchart of a process performed when the change in the display condition of the pre-correction image is applied to the post-correction image. In this case, as performed at Step S101 in the process shown in FIG. 4, first, the sequence controlling unit 142 collects the raw data (Step S201).

Next, as performed at Steps S102 to S104, the image reconstructing unit 143 reconstructs the pre-correction image and the post-correction image (Steps S202 and S203). The image reconstructing unit 143 correlates the reconstructed pre-correction image and post-correction image for each slice position and stores the correlated images in the image storage unit 132 (Step S204).

Then, when the main controlling unit 141 receives the change in the display condition related to the pre-correction image (Yes at Step S205), the image display adjusting unit 144 updates the extra information of the pre-correction image and of the post-correction image based on the changed display condition (Step S206).

When the main controlling unit 141 receives the display request for the post-correction image (Yes at Step S207), the image display controlling unit 145 reads the requested post-correction image from the image storage unit 132 and changes the display condition based on the display setting information included in the extra information. The image display controlling unit 145 then displays the post-correction image (Step S208).

As described above, the main controlling unit 141 receives the change in the display condition related to the pre-correction image. The image display adjusting unit 144 updates the extra information of the pre-correction image and of the post-correction image based on the change in the display condition received by the main controlling unit 141. Then, when the main controlling unit 141 receives the display request for the post-correction image, the image display controlling unit 145 changes the display condition based on the extra information updated by the image display adjusting unit 144 and displays the post-correction image. Therefore, display conditions of a plurality of related reconstructed images can be changed in conjunction.

As described above, when the display condition related to the reconstructed image of one of either the pre-correction image and the post-correction image stored in the image storage unit 132 is changed, the changed display condition is applied to the other reconstructed image. As a result, the change in the display condition can be bi-directionally applied. Consequently, work related to in changes being made in the display conditions can be further reduced.

For example, in the MRI apparatus 50, a screen for setting a slice position before imaging (referred to, hereinafter, as a "collection screen") and a screen for checking a scan image (referred to, hereinafter, as a "display screen") are used. The collection screen displays the pre-correction image as a positioning image. The display screen displays the post-correction image as an image used for checking.

In this instance, for example, the operator sets the slice position on the positioning image using the collection screen and checks an image acquired as a result using the display screen. The operator then returns to the collection screen and performs a next imaging operation using the image checked using the display screen as the positioning image. Imaging can be repeated in this way.

In this instance, when the display conditions are bi-directionally linked between the pre-correction image and the post-correction image as described above, the display condition is not required to be changed for each screen. Imaging can be efficiently repeated. Therefore, a total amount of time required for a series of imaging operations can be shortened.

According to the embodiment, when the display conditions are changed in conjunction for the reconstructed images reconstructed before and after the distortion caused by a disturbance in the magnetic field is corrected has been described. However, the present invention is not limited thereto. The present invention can be similarly applied to other combinations of reconstructed images.

For example, reconstructed time-sequence images taken by dynamic MRI (dynamic imaging) can be correlated and stored. The dynamic MRI dynamically performs imaging. When a display condition related to a reconstructed image of a time phase serving as a reference point is changed, a display condition related to a reconstructed image of another time phase at a same slice position can be changed in conjunction.

In this case, when a plurality of slices are imaged for each time phase, a display condition related to another slice at a same time phase or another slice at another time phase can also be changed in conjunction.

Reconstructed images of differing segments imaged by a moving bed method can be correlated and stored. In the moving bed method, imaging is performed while the top plate is continuously moved. When a display condition related to a reconstructed image of a segment serving as reference is changed, a display condition related to a reconstructed image of another segment at a same slice position can be changed in conjunction.

Reconstructed images of different time phases taken by electrocardiography synchronized imaging and respiration-synchronized imaging can be correlated and stored. For example, when a display condition related to a reconstructed image of a time frame serving as reference is changed, a display condition of a reconstructed image of another time phase at a same slice position can be changed in conjunction.

Reconstructed images having different echo times taken by imaging using a multi-echo method can be correlated and stored. For example, when a display condition related to a reconstructed image of a first echo is changed, display conditions of reconstructed images of second and subsequent echoes at a same slice position can be changed in conjunction.

According to the embodiment, the MRI apparatus has been described. However, the present invention is not limited thereto. For example, the present invention can be similarly applied to an image display system (picture archiving and communication system [PACS]) in which an image server device holding various images and a client device displaying the images are connected by a network.

In this instance, for example, the image server device correlates the pre-correction image and the post-correction image for each slice position and stores the correlated images. The image server device also receives the change in the display condition related to the post-correction image. When the display request for the pre-correction image is received, the client device applies the change in the display condition related to the post correction image received by the image server device and displays the pre-correction image.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
an image reconstructing unit that reconstructs an image from data related to an interior of a subject and collected using magnetic resonance phenomenon;
an image storage unit that correlates a first reconstructed image and a second reconstructed image for each slice position and stores the correlated reconstructed images, the first reconstructed image being reconstructed by the image reconstructing unit, and the second reconstructed image in which data collection or a correction process is performed under a condition differing from that of the first reconstructed image; and
an image display controlling unit that applies a changed display condition to the first reconstructed image, when a display condition of the second reconstructed image stored in the image storage unit is changed.

2. The apparatus according to claim 1, wherein the first reconstructed image is an image before a distortion caused by a disturbance in a magnetic field is corrected, and the second reconstructed image is an image after the distortion caused by the disturbance in the magnetic field is corrected.

3. The apparatus according to claim 1 wherein the first reconstructed image and the second reconstructed image are reconstructed images taken at different time phases by dynamic imaging.

4. The apparatus according to claim 1, wherein the first reconstructed image and the second reconstructed image are reconstructed images taken at different echo times by an imaging operation using a multi-echo method.

5. The apparatus according to claim 1, wherein the display condition is a condition related to an image processing operation including any of an image rotation process, an image inversion process, a panning process, and an enlargement process, or a condition related to a luminance converting process including a window level adjustment and a window width adjustment.

6. The apparatus according to claim 2, wherein the display condition is a condition related to an image processing operation including any of an image rotation process, an image inversion process, a panning process, and an enlargement process, or a condition related to a luminance converting process including a window level adjustment and a window width adjustment.

7. The apparatus according to claim 3, wherein the display condition is a condition related to an image processing operation including any of an image rotation process, an image inversion process, a panning process, and an enlargement process, or a condition related to a luminance converting process including a window level adjustment and a window width adjustment.

8. The apparatus according to claim 4, wherein the display condition is a condition related to an image processing operation including any of an image rotation process, an image inversion process, a panning process, and an enlargement process, or a condition related to a luminance converting process including a window level adjustment and a window width adjustment.

9. A magnetic resonance imaging apparatus comprising:
an image reconstructing unit that reconstructs an image from data related to an interior of a subject and collected using magnetic resonance phenomenon;
an image storage unit that correlates a first reconstructed image and a second reconstructed image for each slice position and stores the correlated reconstructed images, the first reconstructed image being reconstructed by the image reconstructing unit, and the second reconstructed image in which data collection or a correction process is performed under a condition differing from that of the first reconstructed image; and
an image display controlling unit that applies a changed display condition to the second reconstructed image, when a display condition of the first reconstructed image stored in the image storage unit is changed.

10. The apparatus according to claim 9, wherein the first reconstructed image is an image before a distortion caused by a disturbance in a magnetic field is corrected, and the second reconstructed image is an image after the distortion caused by the disturbance in the magnetic field is corrected.

11. The apparatus according to claim 9, wherein the first reconstructed image and the second reconstructed image are reconstructed images taken at different time phases by dynamic imaging.

12. The apparatus according to claim 9, wherein the first reconstructed image and the second reconstructed image are reconstructed images taken at different echo times by an imaging operation using a multi-echo method.

13. The apparatus according to claim 9, wherein the display condition is a condition related to an image processing operation including any of an image rotation process, an image inversion process, a panning process, and an enlargement process, or a condition related to a luminance converting process including a window level adjustment and a window width adjustment.

14. The apparatus according to claim 10, wherein the display condition is a condition related to an image processing operation including any of an image rotation process, an image inversion process, a panning process, and an enlargement process, or a condition related to a luminance converting process including a window level adjustment and a window width adjustment.

15. The apparatus according to claim 11, wherein the display condition is a condition related to an image processing operation including any of an image rotation process, an image inversion process, a panning process, and an enlargement process, or a condition related to a Luminance converting process including a window level adjustment and a window width adjustment.

16. The apparatus according to claim 12, wherein the display condition is a condition related to an image processing operation including any of an image rotation process, an image inversion process, a panning process, and an enlargement process, or a condition related to a luminance converting process including a window level adjustment and a window width adjustment.

17. An image processing apparatus comprising:
an image storage unit that correlates a first reconstructed image and a second reconstructed image for each slice position and stores correlated reconstructed images, the first reconstructed image being reconstructed from data related to an interior of a subject, and the second reconstructed image in which data collection or a correction process is performed under a condition differing from that of the first reconstructed image; and
an image display controlling unit that applies a changed display condition to another reconstructed image, when a display condition of a reconstructed image of one of either the first reconstructed image and the second reconstructed image stored in the image storage unit is changed.

18. An image processing method comprising:
correlating a first reconstructed image and a second reconstructed image for each slice position and storing correlated reconstructed images, the first reconstructed image being reconstructed from data related to an interior of a subject, and the second reconstructed image in which data collection or a correction process is performed under a condition differing from that of the first reconstructed image; and
applying a changed display condition to another reconstructed image, when a display condition of a reconstructed image of one of either the stored first reconstructed image and the stored second reconstructed image is changed.

19. A magnetic resonance imaging apparatus comprising:
an image reconstructing unit that reconstructs a first reconstructed image and a second reconstructed image from data related to an interior of a subject and collected using magnetic resonance phenomenon, the first reconstructed image being reconstructed before a distortion caused by a disturbance in a magnetic field is corrected, and the second reconstructed image being reconstructed after the distortion caused by the disturbance in the magnetic field is corrected;
an image storage unit that correlates the first reconstructed image and the second reconstructed image for each slice position and stores the correlated reconstructed images; and
an image display controlling unit that applies a changed display condition to the first reconstructed image, when a display condition of the second reconstructed image stored in the image storage unit is changed.

* * * * *